(12) United States Patent
Lim et al.

(10) Patent No.: US 11,683,270 B2
(45) Date of Patent: Jun. 20, 2023

(54) COMMUNICATION DEVICE INCLUDING PLURALITY OF CLIENTS

(71) Applicant: Samsung Electronics Co., Ltd., Suwon-si (KR)

(72) Inventors: Ho Lim, Suwon-si (KR); Yong Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 490 days.

(21) Appl. No.: 16/718,401

(22) Filed: Dec. 18, 2019

(65) Prior Publication Data

US 2020/0204493 A1 Jun. 25, 2020

(30) Foreign Application Priority Data

Dec. 19, 2018 (KR) .................. 10-2018-0165474
Apr. 5, 2019 (KR) .................. 10-2019-0040292

(51) Int. Cl.
*H04L 45/745* (2022.01)
*H04L 49/901* (2022.01)

(52) U.S. Cl.
CPC .......... *H04L 45/745* (2013.01); *H04L 49/901* (2013.01)

(58) Field of Classification Search
None
See application file for complete search history.

(56) References Cited

U.S. PATENT DOCUMENTS

| 7,603,503 | B1 | 10/2009 | Hutsell et al. | |
| 7,761,529 | B2 | 7/2010 | Choubal et al. | |
| 8,560,795 | B2 | 10/2013 | Mei et al. | |
| 10,031,884 | B2 | 7/2018 | Han et al. | |
| 10,637,778 | B1* | 4/2020 | Warfield | H04L 41/0803 |
| 2012/0038411 | A1* | 2/2012 | Sugiura | H01L 23/66 |
| | | | | 327/434 |
| 2016/0232125 | A1* | 8/2016 | Han | G06F 16/40 |
| 2020/0146118 | A1* | 5/2020 | Jansma | H05K 7/1492 |
| 2020/0167095 | A1* | 5/2020 | Jung | G06F 3/0659 |

FOREIGN PATENT DOCUMENTS

| JP | 2006053613 A | 2/2006 |
| JP | 2014096708 A | 5/2014 |
| JP | 2014154000 A | 8/2014 |
| KR | 10-2016-0109733 A | 9/2016 |

\* cited by examiner

*Primary Examiner* — Chirag G Shah
*Assistant Examiner* — Srinivasa R Reddivalam
(74) *Attorney, Agent, or Firm* — Harness, Dickey & Pierce, P.L.C.

(57) ABSTRACT

A communication device includes a first client group in a first region; a second client group in a second region different from the first region; a first data hub configured to generate first burst data and a first control packet based on first client data received from the first client group; a second data hub configured to generate second burst data and a second control packet based on second client data received from the second client group; and a data transfer unit connected to the first data hub and the second data hub via a control protocol, the data transfer unit configured to, store the first burst data in a target memory based on the first control packet, and store the second burst data in the target memory based on the second control packet.

19 Claims, 7 Drawing Sheets

COMMUNICATION DEVICE INCLUDING PLURALITY OF CLIENTS

CROSS-REFERENCE TO RELATED APPLICATIONS

This application claims the benefit of Korean Patent Application No. 10-2018-0165474, filed on Dec. 19, 2018, and Korean Patent Application No. 10-2019-0040292, filed on Apr. 5, 2019, in the Korean Intellectual Property Office, the disclosures of which are incorporated herein in their entirety by reference.

BACKGROUND

The inventive concepts relate to a communication device, and more particularly, to a communication device including a plurality of clients.

Semiconductor memory devices are memory devices implemented by using semiconductors such as silicon (Si), germanium (Ge), gallium arsenide (GaAs), and indium phosphide (InP). Semiconductor memory devices may be broadly classified into volatile memory devices and non-volatile memory devices.

In the case of memory device structures incorporated into communication devices, the number of clients and amount of client data for processing has increased. Because the number of clients increases as communication systems increase in scale and communication functions expand, the size of controllers of multi-layer memory structures, and in the number of electrical connections between the clients and the multi-layer memory, increase, and thus, the area efficiency of the chips into which the controllers and multi-layer memory structures are incorporated may deteriorate. Therefore, a method capable of processing a large amount of complicated client data while improving the area efficiency of chips would be desirable.

SUMMARY

The inventive concepts provide a communication device including a data hub that groups hardware clients according to physical positions and processes data of the grouped clients.

According to an aspect of the inventive concepts, there is provided a communication device, which includes a first client group including a plurality of first clients in a first region, a second client group including a plurality of second clients in a second region different from the first region, a first data hub configured to generate first burst data and a first control packet based on first client data received from the first client group, the first control packet including a first destination address of the first burst data, a second data hub configured to generate second burst data and a second control packet based on second client data received from the second client group, the second control packet including a second destination address of the second burst data, and a data transfer unit connected to the first data hub and the second data hub via a control protocol, the data transfer unit configured to, store the first burst data in a target memory based on the first control packet, and store the second burst data in the target memory based on the second control packet.

According to an aspect of the inventive concepts, there is provided a communication device, which includes a first power supply, a second power supply, a plurality of first clients connected to the first power supply, a plurality of second clients connected to the second power supply, a first data hub configured to receive first client data from each of the plurality of first clients, a second data hub configured to receive second client data from each of the plurality of second clients, a data transfer unit configured to, receive a first control packet and first burst data from the first data hub, and receive a second control packet and second burst data from the second data hub, and a target memory connected to the data transfer unit.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Figure 1:
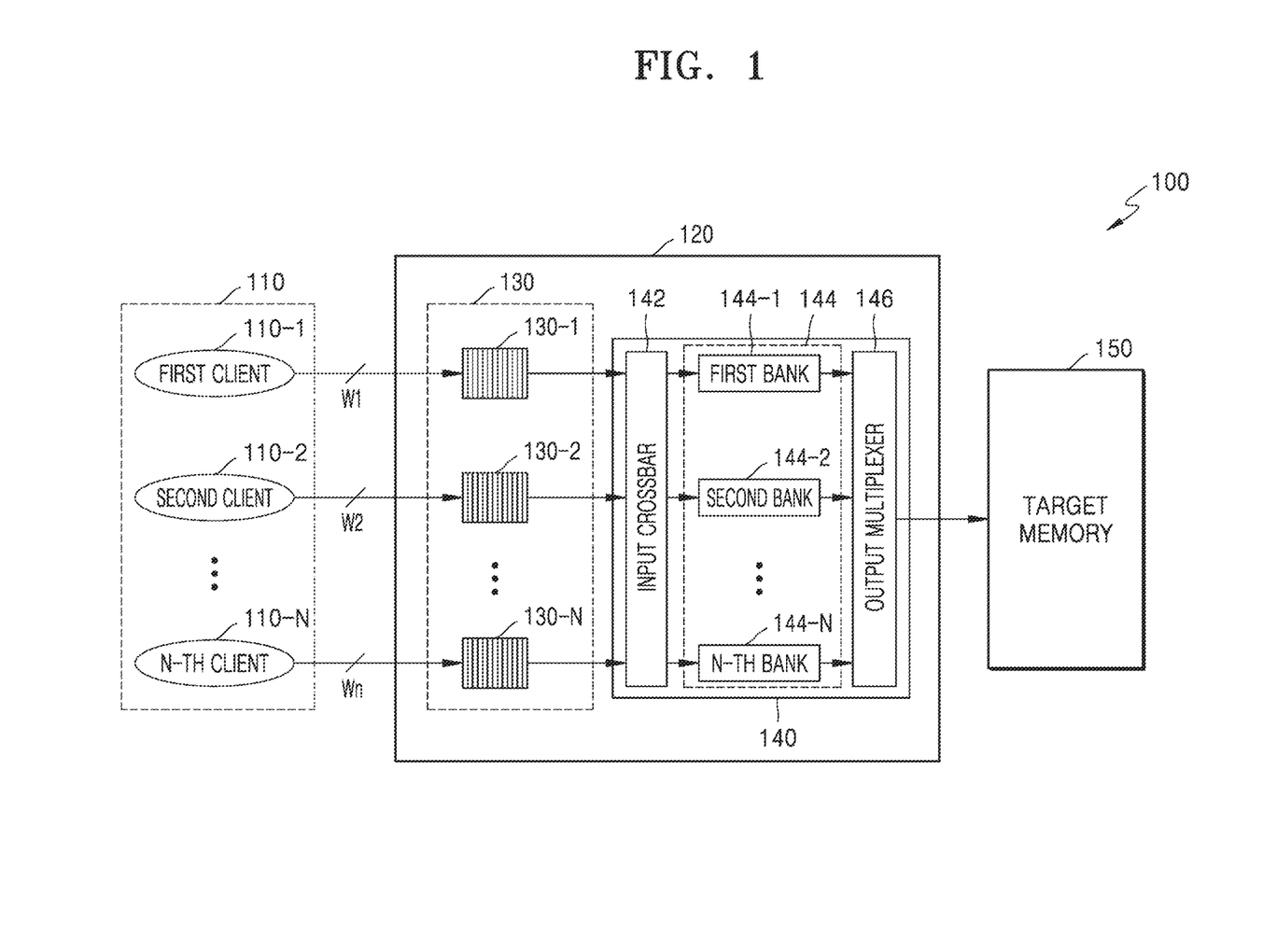
FIG. 1 illustrates an example of a multi-layer memory structure.

FIG. 1 illustrates an example of a multi-layer memory structure.

Referring to FIG. 1, multi-layer memory 100 may include a plurality of clients 110 (e.g., the first client 110-1, the second client 110-2 to the N-th client 110-N), a controller 120, and/or a target memory 150.

According to various embodiments, the plurality of clients 110 (also referred to herein as the plurality of clients 110-1 to 110-N) may correspond to hardware blocks. The plurality of clients 110-1 to 110-N may include a first client 110-1 to an N-th client 110-N. Each of the plurality of clients 110-1 to 110-N may correspond to a hardware block for performing signal processing. As an example, the first client 110-1 may be a sampling block. The sampling block may receive a radio-frequency (RF) signal and/or quantize the received RF signal. As another example, the second client 110-2 may be an analog-to-digital conversion block. The analog-to-digital conversion block may convert a quantized RF analog signal into a digital signal. As yet another example, the N-th client 110-N may be a modulation block. The modulation block may perform frequency modulation and/or amplitude modulation on a transmission signal.

According to various embodiments, the controller 120 may receive client data from the plurality of clients 110-1 to 110-N and transfer the client data to the target memory 150.

For example, the controller 120 may have a multi-layer structure including first-layer memory 130 and/or second-layer memory 140.

According to various embodiments, the first-layer memory 130 may temporarily store client data. The first-layer memory 130 may include a plurality of buffer memories 130-1 to 130-N (e.g., the first buffer memory 130-1, the second buffer memory 130-2 to the N-th buffer memory 130-N). The plurality of buffer memories 130-1 to 130-N may respectively correspond to the plurality of clients 110-1 to 110-N. For example, first buffer memory 130-1 may temporarily store client data W1 generated by the first client 110-1. As another example, second buffer memory 130-2 may temporarily store client data W2 generated by the second client 110-2.

According to an embodiment, the plurality of buffer memories 130-1 to 130-N may store and output client data according to a first in first out (FIFO) method. The plurality of buffer memories 130-1 to 130-N may output data to the second-layer memory 140 in the order that the data is stored in each buffer memory.

According to various embodiments, the second-layer memory 140 may include an input crossbar 142, bank memory 144 including a first bank 144-1 to an N-th bank 144-N (e.g., the first bank 144-1, the second bank 144-2 to an N-th bank 144-N), and/or an output multiplexer 146.

According to an embodiment, the input crossbar 142 may receive data from the first-layer memory 130 and switch the data to the bank memory 144. For example, the input crossbar 142 may receive N inputs W1 to Wn from the first buffer memory 130-1 to the N-th buffer memory 130-N (e.g., the N inputs W1 to Wn correspond to the client data W1 to Wn) and output data to the first bank 144-1 to the N-th bank 144-N, respectively. The output multiplexer 146 may output the data (e.g., one of pieces of data) stored in the plurality of banks 144-1 to 144-N. According to some example embodiments, operations described herein as being performed by the plurality of clients 110, the controller 120, the input crossbar 142 and/or the output multiplexer 146 may be performed by processing circuitry. The term 'processing circuitry,' as used in the present disclosure, may refer to, for example, hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

According to various embodiments, the target memory 150 may store data that is output from the second-layer memory 140. The target memory 150 may be understood as a third-layer memory among memories of the multi-layer memory 100. Although not shown, a processor (e.g., an application processor) may read the data stored in the target memory 150 and/or perform data processing thereon.

That is, in a structure of the multi-layer memory 100, when client data is requested for data processing, the processor may be connected only to the target memory 150 and not connected to the plurality of clients 110-1 to 110-N, thereby reducing the number of electrical connections in the multi-layer memory 100 and improving the area efficiency of chips containing the multi-layer memory 100. In addition, in the structure of the multi-layer memory 100, data processing efficiency may also be improved because the processor accesses only the target memory 150 instead of making a direct request to a client (e.g., a direct request corresponding to the client data among the plurality of clients 110-1 to 110-N).

However, as the number of clients used for signal processing has rapidly increased along with the development of communication systems, the number of electrical connections between the plurality of clients 110-1 to 110-N and the controller 120 has rapidly increased. In addition, because a bank memory includes the same number of banks or a similar number of banks as the number of clients, the complexity of a logic circuit for controlling the bank memory has increased, and the size of the controller 120 has also increased. Thus, the area efficiency of chips has rapidly reduced. Hereinafter, a multi-layer memory structure for increasing the area efficiency of chips will be described with reference to FIGS. 2 to 4.

Figure 2:
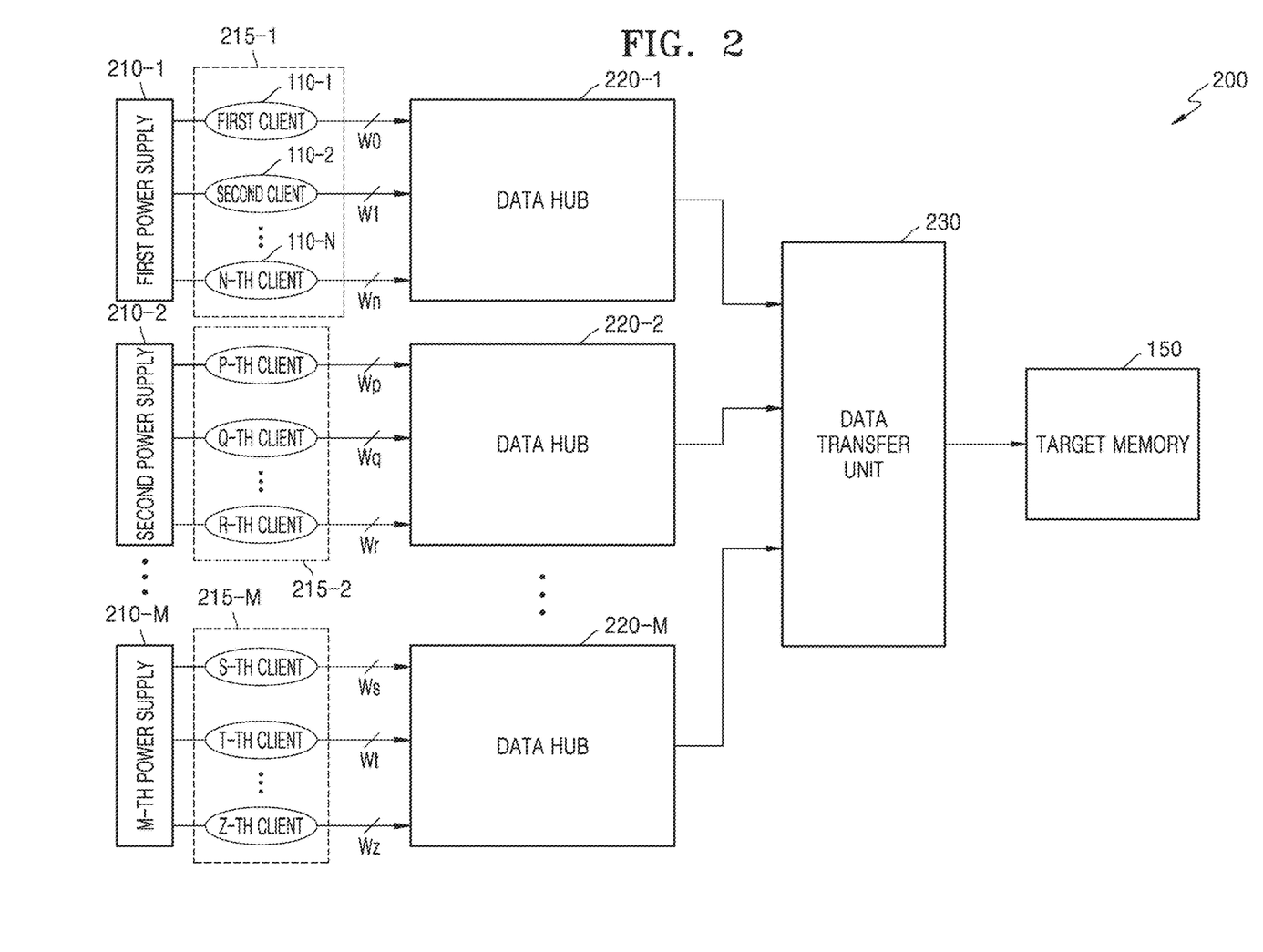
FIG. 2 illustrates an example of a multi-layer memory structure according to an example embodiment of the inventive concepts.

FIG. 2 illustrates an example of a multi-layer memory structure according to an example embodiment of the inventive concepts. Repeated descriptions given with reference to FIG. 1 will be omitted.

Referring to FIG. 2, a multi-layer memory 200 according to an example embodiment of the inventive concepts may include a plurality of power supplies 210-1 to 210-M (e.g., the first power supply 210-1, the second power supply 210-2 to the M-th power supply 210-M), a plurality of client groups 215-1 to 215-M (e.g., the first client group 215-1, the second client group 215-2 to the M-th client group 215-M), a plurality of data hubs 220-1 to 220-M (e.g., the first data hub 220-1, the second data hub 220-2 to the M-th data hub 220-M), a data transfer unit 230, and/or the target memory 150.

According to various embodiments, each of the plurality of power supplies 210-1 to 210-M may be electrically connected to a plurality of clients and may supply power to the plurality of clients. For example, a first power supply 210-1 may supply power to a first client 110-1 to an N-th client 110-N.

According to various embodiments, each of the plurality of client groups 215-1 to 215-M (also referred to herein as the plurality of group clients 215-1 to 215-M) may be a set of clients connected to the same power supply or a similar power supply. For example, a first group client 215-1 may include the first client 110-1 to the N-th client 110-N, which are connected to a first power supply 210-1 and supplied with power. As another example, a second group client 215-2 including the P-th client, the Q-th client to the R-th client may be electrically connected to a second power supply 210-2. As another example, an M-th group client 215-M including the S-th client, the T-th client to the Z-th client may be electrically connected to an M-th power supply 210-M. According to some example embodiments, the quantity of clients in each group client may vary from the example depicted in FIG. 2. According to some example embodiments, operations described herein as being performed by the plurality of client groups 215-1 to 215-M (and/or the clients grouped therein), the plurality of data hubs 220-1 to 220-M and/or the data transfer unit 230 may be performed by processing circuitry.

According to an embodiment, one group client (for example, one of the first to M-th group clients 215-1 to 215-M) may include a plurality of clients that are physically adjacent to each other. For example, the first to N-th clients 110-1 to 110-N included in the first group client 215-1 may be arranged physically adjacent to each other. Physically adjacent clients may share a power source, thereby reducing lengths of wiring lines for electrical connection within a chip having a limited area. That is, in the case of the multi-layer memory 100 in FIG. 1, each of the plurality of clients (the first to N-th clients 110-1 to 110-N in FIG. 1) may use a different wiring line for electrical connection to the controller 120 in FIG. 1. However, in the case of the multi-layer memory 200 in FIG. 2, because each client is not connected to the data transfer unit 230 and only connected to a data hub physically adjacent to the client among the data hubs 220-1 to 220-M, the area efficiency of chips may be increased.

According to an embodiment, one group client (for example, one of the first to M-th group clients 215-1 to 215-M) may include a plurality of clients that are functionally the same as or similar to each other. That is, the plurality of clients may be grouped based on functions of processing circuitry (e.g., hardware blocks). For example, one group client may include a client performing modulation and a client performing demodulation. According to various embodiments, in the case where a plurality of clients that are functionally the same as or similar to each other share a power source, and when a functionally similar group client does not operate, a processor (e.g., an application processor) may prevent excessive power consumption by adaptively (e.g., dynamically) powering off the power source (e.g., the shared power source). According to some example embodiments, the application processor (AP) and the multi-layer memory 200 may be implemented as a single chip.

According to various embodiments, the plurality of data hubs 220-1 to 220-M may respectively correspond to the plurality of group clients 215-1 to 215-M. For example, a first data hub 220-1 may be connected to the first group client 215-1, and a second data hub 220-2 may be connected to the second group client 215-2. Each of the plurality of data hubs 220-1 to 220-M may receive client data from a corresponding group client and process the client data. Each of the plurality of data hubs 220-1 to 220-M may transmit the processed client data to the data transfer unit 230. Hereinafter, specific components included in a data hub will be described with reference to FIG. 3.

According to various embodiments, the data transfer unit 230 may be connected to the plurality of data hubs 220-1 to 220-M. The data transfer unit 230 may receive processed client data and a control packet from each of the plurality of data hubs 220-1 to 220-M. The data transfer unit 230 may communicate with each of the plurality of data hubs 220-1 to 220-M according to an independent control protocol. Descriptions of specific components included in the data transfer unit, descriptions of the control packet, and descriptions of the control protocol will be respectively made below with reference to FIGS. 4, 5, and 6.

Figure 3:
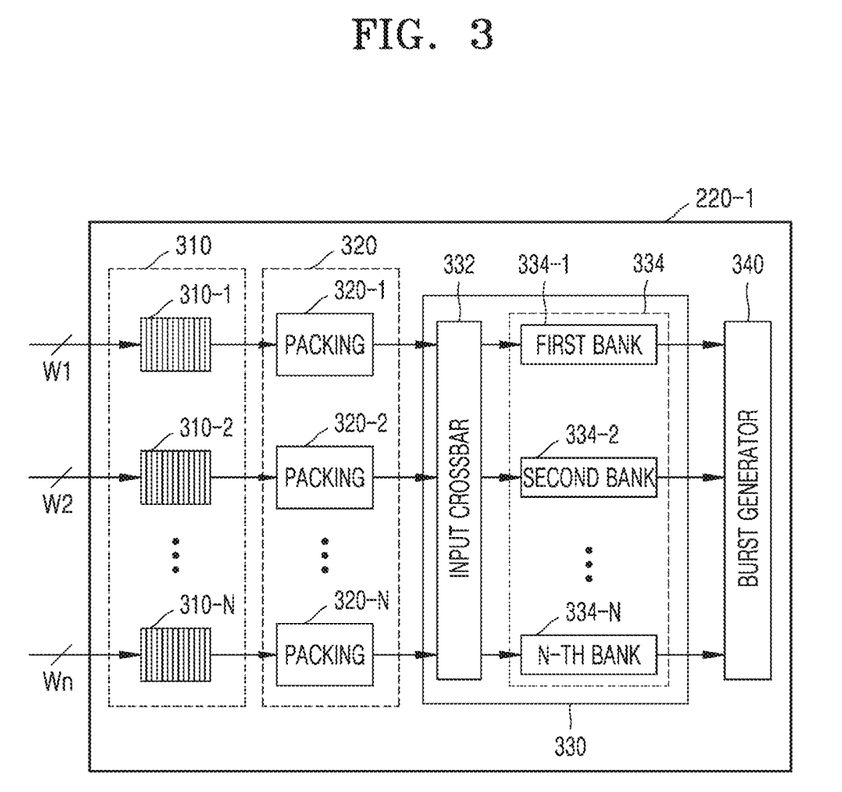
FIG. 3 illustrates an example of a data hub according to an example embodiment of the inventive concepts.

FIG. 3 illustrates an example of a data hub according to an example embodiment of the inventive concepts.

According to various embodiments, the data hub in FIG. 3 may correspond to the first data hub 220-1 in FIG. 2, and the same or a similar corresponding manner as this may be applied to each of the remaining data hubs 220-2 to 220-M.

Referring to FIG. 3, the first data hub 220-1 may include first-layer memory 310, a packing unit 320, second-layer memory 330, and/or a burst generator 340.

The first-layer memory 310 may include a plurality of buffer memories 310-1 to 310-N (e.g., the first buffer memory 310-1, the second buffer memory 310-2 to the N-th buffer memory 310-N). The first-layer memory 310 shown in FIG. 3 may correspond to the first-layer memory 130 shown in FIG. 1. Each of the plurality of buffer memories 310-1 to 310-N may receive client data from a respective client and buffer (e.g., store) the received client data.

The packing unit 320 (e.g., the first packing block 320-1, the second packing block 320-2 to the N-th packing block) may adjust the number of bits of data received by the packing unit 320 and transmit the adjusted number of bits of data to the second-layer memory 330. Client data may have various sizes depending upon clients generating the client data. For example, referring to FIG. 1, client data output from a sampling block of the first client 110-1 may be different in size from client data output from an analog-to-digital conversion block of the second client 110-2. Therefore, the packing unit 320 may adjust the number of bits of each piece of client data having a different size such that each piece of client data has a standardized size (e.g., a defined data size). The standardized size may be predefined or defined. For example, the standardized size may equal 128 bits. According to an embodiment, a first packing block 320-1 may receive 32 bits of client data (e.g., the client data W1) output from first buffer memory 310-1. A second packing block 320-2 may receive 256 bits of client data (e.g., the client data W2) output from second buffer memory 310-2. In this case, to output 128 bits, the first packing block 320-1 may add 96 bits of dummy data to the received 32 bits of client data. To output 128 bits, the second packing block 320-2 may remove some bits from the 256 bits. Therefore, pieces of client data having the same number or a similar number of bits (for example, 128 bits) may be transmitted to the second-layer memory 330. According to some example embodiments, the client data may be transmitted by the packing unit 320 to the second-layer memory 330 in parallel.

According to various embodiments, the second-layer memory 330 may include an input crossbar 332 and/or a bank memory 334 (e.g., the first bank memory 334-1, the second bank memory 334-2 to the N-th bank memory 334-N). The input crossbar 332 and the bank memory 334, which are shown in FIG. 3, may respectively correspond to the input crossbar 142 and the bank memory 144, which are shown in FIG. 1. According to an embodiment, the bank memory 334 may include a first bank 334-1 to an N+1-th bank (not shown). That is, when the number of clients connected to the first data hub 220-1 is N, the bank memory 334 may include N+1 banks. Due to interleaving characteristics of the bank memory 334, the bank memory 334 may further include one bank for outputting data to the burst generator 340. For example, each of the first to N-th banks 334-1 to 334-N may receive, at a predefined or defined timing, client data via the first-layer memory 310, the packing unit 320, and the input crossbar 332. The N+1-th bank may transmit one of the pieces of client data of a first group client to the burst generator 340 at a predefined or defined timing.

In various embodiments, the number of banks included in the bank memory 334 may be set to an appropriate number when a chip is designed. This is because, when N is an excessively great value, the area efficiency of chips may be reduced due to a large size of a logic circuit for controlling the bank memory 334. According to some example embodiments, appropriate number of banks included in the bank memory 334 may be a design parameter determined through empirical study.

According to various embodiments, the burst generator 340 may generate burst data. The burst data may refer to a valid minimum unit of data (e.g., a lowest or low data amount or size) that may be (e.g., able to be) processed by a processor (e.g., the application processor, not shown) connected to the multi-layer memory 200 in FIG. 2. According to some example embodiments, the valid minimum unit of data may be a standardized (e.g., defined) data size). According to some example embodiments, the burst generator 340 may generate a control packet (discussed further in association with FIG. 5) based on one of a plurality of pieces of client data generated by a plurality of clients (for example, the first to N-th clients 110-1 to 110-N) that are included in the first group client. The burst generator 340 may transmit the control packet to the data transfer unit 230 (e.g., according to an internal clock signal and based on a ready signal received from the data transfer unit). According to some example embodiments, the burst generator 340 may coordinate transmission of the burst data and/or the control packet with the data transfer unit 230 according to a control protocol. In the control protocol, the burst generator 340 may generate and transmit a control signal, a data signal and/or an interrupt signal (e.g., a data hub interrupt signal) to the data transfer unit 230, and/or receive the ready signal from the data transfer unit 230 (discussed further in association with FIG. 6). In an embodiment, the burst generator 340 may generate burst data based on one of a plurality of pieces of client data generated by a plurality of clients (for example, the first to N-th clients 110-1 to 110-N) that are included in the first group client. That is, the burst generator 340 may generate burst data based on data stored in one of the first to N-th banks 334-1 to 334-N of the bank memory 334. The burst generator 340 may select the one piece of client data based on a predefined or defined priority. The burst generator 340 may transmit the generated burst data to the data transfer unit 230. According to some example embodiments, the burst generator 340 may transmit the generated burst data to the data transfer unit 230 according to an internal clock signal and based on the ready signal received from the data transfer unit. According to some example embodiments, operations described herein as being performed by the packing unit 320, the input crossbar 332 and/or the burst generator 340 may be performed by processing circuitry.

Figure 4:
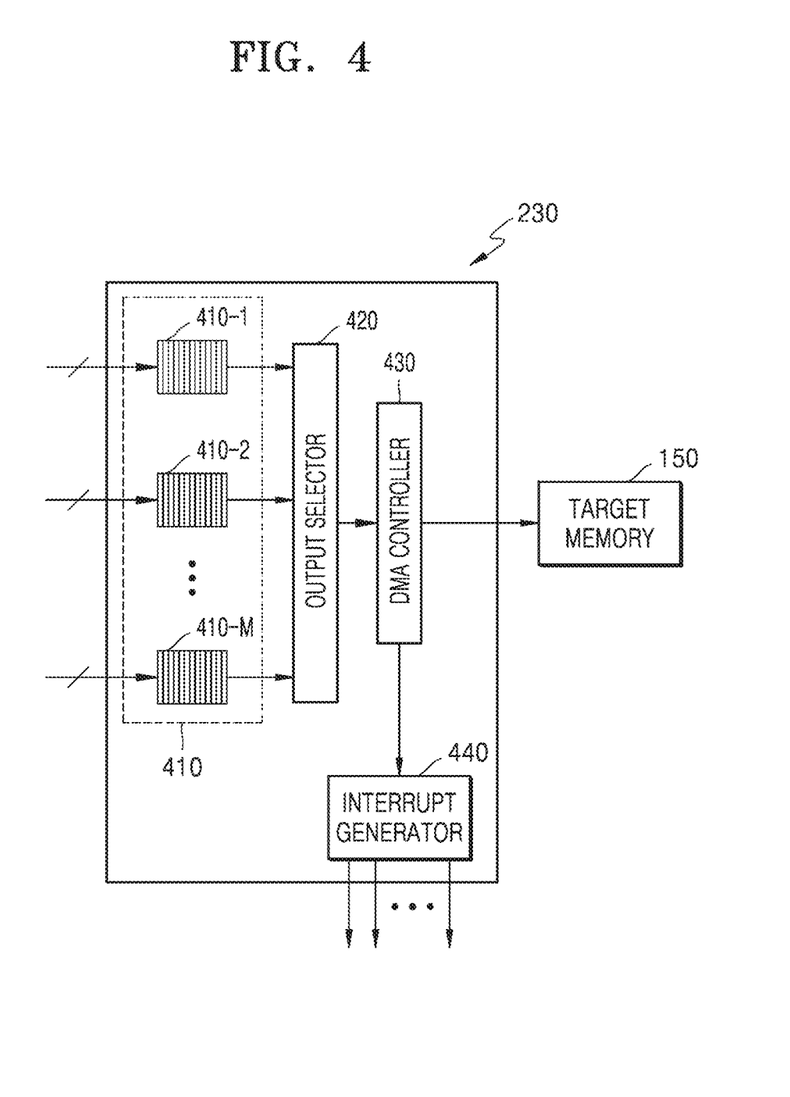
FIG. 4 illustrates an example of a data transfer unit according to an example embodiment of the inventive concepts.

FIG. 4 illustrates an example of a data transfer unit according to an example embodiment of the inventive concepts.

Referring to FIG. 4, the data transfer unit 230 may include third-layer memory 410, an output selector 420, a direct memory access (DMA) controller 430, and/or an interrupt generator 440. According to some example embodiments, operations described herein as being performed by the output selector 420, the DMA controller 430 and/or the interrupt generator 440 may be performed by processing circuitry.

According to various embodiments, the third-layer memory 410 may include a plurality of buffer memories 410-1 to 410-M (e.g., a first buffer memory 410-1, a second buffer memory 410-2 to an M-th buffer memory 410-M). The plurality of buffer memories 410-1 to 410-M may respectively correspond to the plurality of data hubs 220-1 to 220-M. For example, first buffer memory 410-1 of the third-layer memory 410 may receive first burst data from the first data hub 220-1. The first burst data may be generated based on client data of a first group client (e.g., the first group client 215-1). As another example, second buffer memory 410-2 of the third-layer memory 410 may receive second burst data from the second data hub 220-2. The second burst data may be generated based on client data of a second group client (e.g., the second group client 215-2).

According to various embodiments, the output selector 420 may transmit one of a plurality of pieces of burst data (e.g., selected burst data) to the DMA controller 430. The output selector 420 may output one piece of burst data of a plurality of pieces of burst data temporarily stored in the plurality of buffer memories 410-1 to 410-M of the third-layer memory 410. According to an embodiment, because the output selector 420 only output the selected one piece of burst data, the output selector 420 may not use a logic circuit having high complexity. In addition, as compared with the data hub (for example, the first data hub 220-1) in FIG. 3, the output selector 420 may not include a circuit for additional control, and/or a bank memory. According to some example embodiments, the DMA controller 430 may generate a ready signal indicating whether the plurality of buffer memories 410-1 to 410-M are full, and transmit the ready signal to the plurality of data hubs 220-1 to 220-M.

According to various embodiments, the DMA controller 430 may store data at a destination address of the target memory 150. For example, the DMA controller 430 may identify a destination address (e.g., according to the burst offset bit contained in a control packet received from one of the plurality of data hubs 220-1 to 220-M), at which burst data output from the output selector 420 is to be stored, and may store the output burst data at the destination address. According to an embodiment, when data transmission from the DMA controller 430 to the target memory 150 is initially set up, the DMA controller 430 may receive a control signal from a processor (e.g., the application processor, not shown) and may complete the data transmission without control by the processor (not shown). When the data transmission is completed, the DMA controller 430 may indicate the completion of the data transmission by transmitting an interrupt (e.g., using the interrupt generator 440) to the processor (not shown). According to some example embodiments, the interrupt generator 440 may be included in the DMA controller 430. According to some example embodiments, the DMA controller 430 may control the interrupt generator 440 to generate the interrupt (e.g., a data transfer unit interrupt) by transmitting a command signal to the interrupt generator 440.

Figure 5:
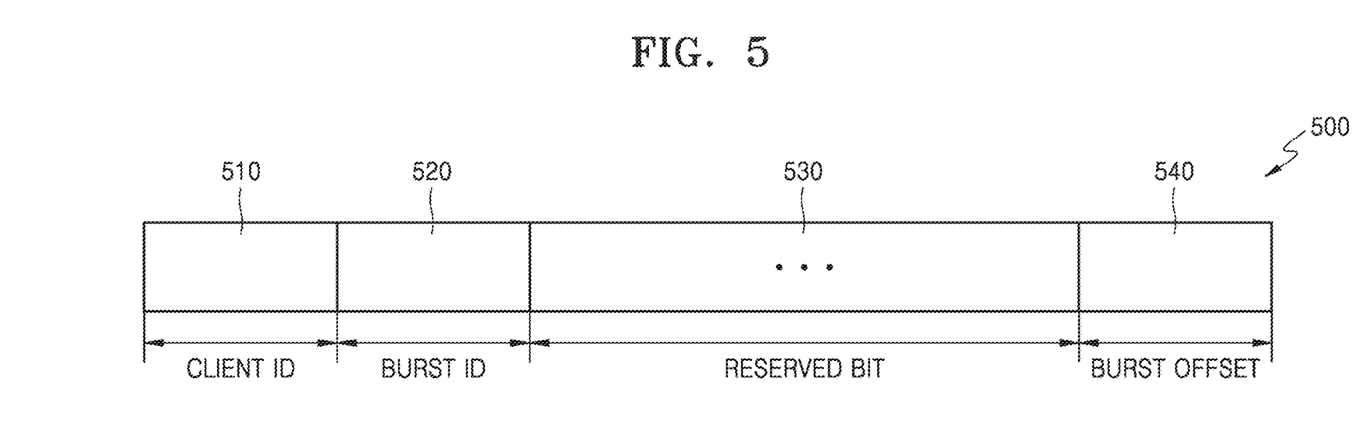
FIG. 5 illustrates an example of a control packet according to an example embodiment of the inventive concepts.

FIG. 5 illustrates an example of a control packet, according to an example embodiment of the inventive concepts.

Referring to FIG. 5, a control packet 500 may include a first bit 510, a second bit 520, a third bit 530, and/or a fourth bit 540. As used herein, each of the first bit 510, the second bit 520, the third bit 530 and/or the fourth bit 540 may refer to a field having a data size of one bit or more than one bit.

According to various embodiments, the first bit 510 may include a client identification (ID) bit. The client ID bit may correspond to a bit indicating (e.g., identifying) a client. That is, the first bit 510 may include a bit indicating one of the plurality of clients in FIG. 2. As an example, the first bit 510 may include a bit indicating a group client and a bit indicating one client in the group client.

According to various embodiments, the second bit 520 may include burst ID bits. Each of the burst ID bits may correspond to a bit for indicating the type of burst data. For example, by decrypting the second bit 520, the DMA controller 430 may identify the type of received burst data and/or may determine an interrupt to process the burst data (e.g., to cause the burst data to be processed). The DMA controller 430 may generate the determined interrupt by using the interrupt generator 440 and may transmit the interrupt to a processor (e.g., the application processor). According to some example embodiments, the burst ID bit may indicate an interrupt corresponding to the burst data.

According to various embodiments, the third bit 530 may include a reserved bit. The reserved bit may correspond to a preliminary bit for including various control information. For example, when a functional block for encryption of client data and/or burst data is added, the reserved bit may include information (for example, a parity bit) for decryption of the encrypted client data and/or burst data.

According to various embodiments, the fourth bit 540 may include a burst offset bit. The burst offset bit may indicate a destination address of the target memory 150, at which burst data is stored. The DMA controller 430 may identify the destination address by decrypting the fourth bit 540 and may transmit, to the target memory 150, the burst data and information indicating the destination address.

Figure 6:
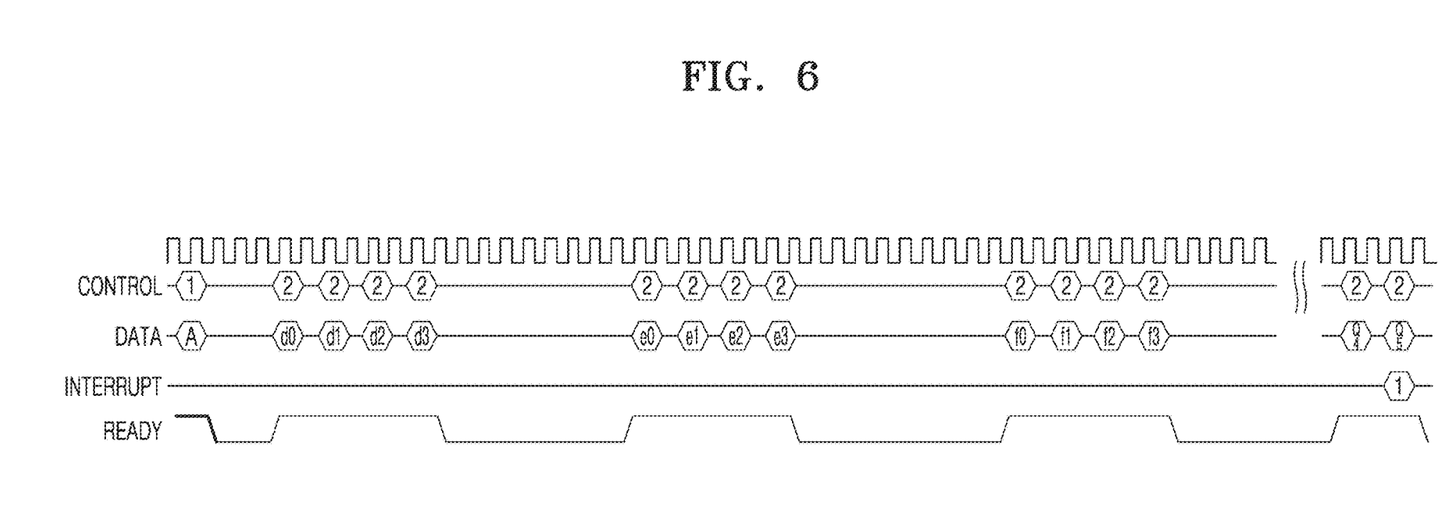
FIG. 6 illustrates an example of a control protocol between a data hub and a data transfer unit, according to an example embodiment of the inventive concepts.

FIG. 6 illustrates an example of a control protocol between a data hub and a data transfer unit, according to an example embodiment of the inventive concepts.

Referring to FIGS. 3, 4, and 6, a control protocol between the first data hub 220-1 and the data transfer unit 230 may include a ready signal, an interrupt signal, a data signal, and/or a control signal.

According to various embodiments, the ready signal may indicate a storage state of the third-layer memory 410 of the data transfer unit 230. The ready signal may indicate whether the third-layer memory 410 is full or has free storage space. The ready signal may be a 1-bit signal. Because the plurality of buffer memories 410-1 to 410-M included in the third-layer memory 410 store data in a FIFO manner, unless the stored data is output via the output selector 420, there may be insufficient storage space in the buffer memories. For example, when the first buffer memory 410-1 is full of data, the data transfer unit 230 may transmit a ready signal that is logic low or "0" to the first data hub 220-1 corresponding to the first buffer memory 410-1. When receiving the ready signal that is logic low, the first data hub 220-1 may identify that there is no space for storing data of a first group client in the data transfer unit 230 and may delay data transmission. As another example, when there is free storage space in the first buffer memory 410-1, the data transfer unit 230 may transmit a ready signal that is logic high or "1" to the first data hub 220-1. When receiving the ready signal that is logic high, the first data hub 220-1 may transmit burst data generated based on data received from the first group client 215-1. That is, the ready signal may prevent or reduce the loss of client data between a data hub and a data transfer unit by indicating a storage state of buffer memory in the data transfer unit 230.

According to various embodiments, the control signal may indicate the type of data transmitted from the data hub 220-1 to the data transfer unit 230. The control signal may include 2 bits. For example, when the control signal is "1", the control packet shown in FIG. 5 may be transmitted to the data transfer unit 230 (e.g., by the data hub 220-1). As another example, when the control signal is "2", the data hub 220-1 may transmit burst data to the data transfer unit 230. The data hub 220-1 may set the control signal to "1" at a timing of first transmission of burst data and may transmit a control packet to the data transfer unit 230, thereby transmitting, in advance, information related to burst data to be transmitted from the next timing (for example, the type of burst data, the type of interrupt, a client ID making transmission, and/or a destination address of the target memory 150).

According to various embodiments, the data signal may include data transmitted from the data hub 220-1 to the data transfer unit 230. When the control signal is "1", the data signal may include a control packet. When the control signal is "2", the data signal may include burst data. For example, the data hub 220-1 may transmit burst data (d0, d1, d2, and d3 in FIG. 6) according to an internal clock signal. According to various embodiments, the data signal may be dependent on the ready signal. For example, when the ready signal is logic high or "1", because the buffer memory of the data transfer unit 230 is not full, the burst data or the control packet may be transmitted to the data transfer unit 230. However, when the ready signal is logic low or "0", because the buffer memory of the data transfer unit 230 is full, the burst data or the control packet may not be transmitted.

According to various embodiments, the interrupt signal may indicate that the transmission of burst data is completed. The interrupt signal may correspond to a 1-bit signal. When the interrupt signal is logic high or "1", the data transfer unit 230 may identify that the transmission of burst data is completed. For example, referring to FIG. 6, after the data transfer unit 230 receives a control packet at a timing at which the control signal is "1", the data transfer unit 230 may determine, as burst data, data (for example, d0 to d3, e0 to e3, f0 to f3, Q4, and Q5) received until a timing at which the interrupt signal becomes "1".

Figure 7A:
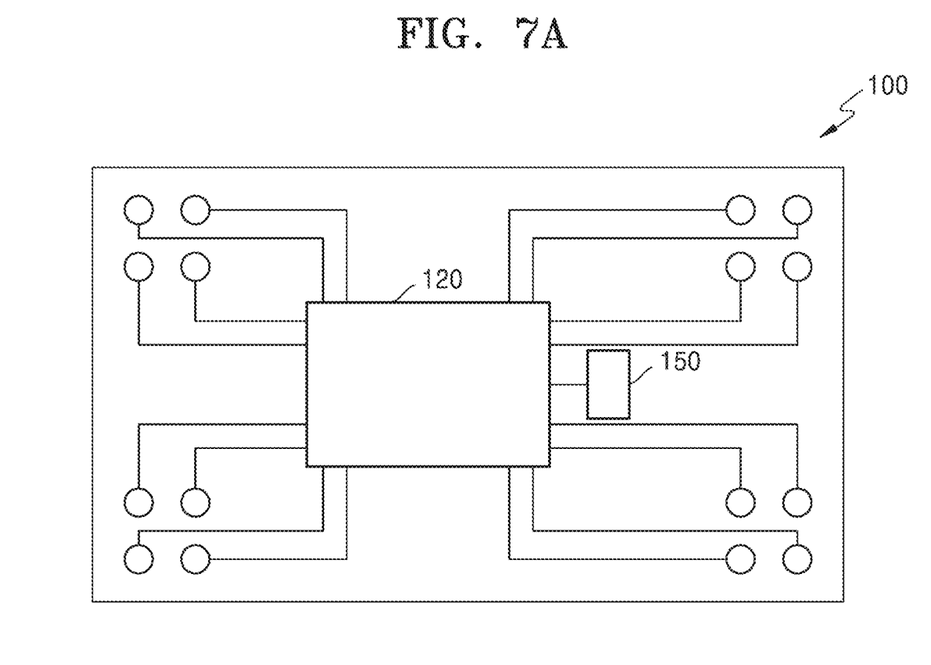
FIG. 7A illustrates a circuit arrangement of multi-layer memory.
Figure 7B:
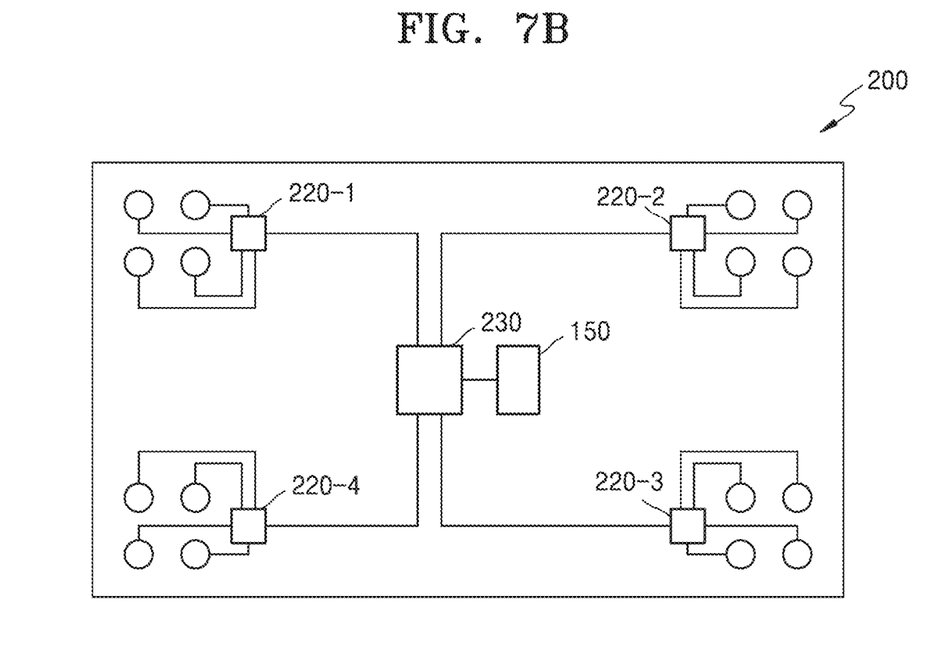
FIG. 7B illustrates a comparison example of a circuit arrangement of multi-layer memory, according to an example embodiment of the inventive concepts.

FIG. 7A illustrates a circuit arrangement of multi-layer memory, and FIG. 7B illustrates a comparison example of a circuit arrangement of multi-layer memory, according to an example embodiment of the inventive concepts.

Referring to FIG. 7A, as described above, the multi-layer memory 100 may include a three-layer memory structure. A plurality of clients may be arranged throughout a chip area. Each of the plurality of clients may be connected to the controller 120. Therefore, among the plurality of clients, except for some clients located close (e.g., within a certain distance from the controller 120), there may be electrical wiring lines for connection to the controller 120 (e.g., except for other clients located far or further away from the controller 120 by as much as the certain distance or more). As the number of electrical wiring lines between the controller 120 and the clients far or further from the controller 120 increases, the space efficiency of the entire chip area may be reduced. In addition, although not shown, sizes of pieces of client data processed and/or generated by each client may also increase along with the development of communication systems. When the size of client data increases, a physical size of an electrical wiring line for transmitting the client data also increases, and thus, the space efficiency of the entire chip may be deteriorated. In addition, because the controller 120 performs reception and/or processing of data from all the clients and stores the data in the target memory 150, the complexity of a logic circuit for control by the controller 120 also increases (e.g., exponentially) with the increasing number of clients, and thus, the size of the controller 120 may increase.

Referring to FIG. 7B, as described above, a plurality of clients may be connected to a plurality of data hubs 220-1 to 220-4 (e.g., the first data hub 220-1, the second data hub 220-2, the third data hub 220-3 and the fourth data hub 220-4) The data transfer unit 230 may receive burst data from each of the plurality of data hubs 220-1 to 220-4 and transfer the burst data to the target memory 150.

According to various embodiments, each data hub may be connected to clients arranged physically within a certain distance (e.g., a threshold distance) therefrom. For example, the first data hub 220-1 may be connected to a plurality of clients included in a first region, and the second data hub 220-2 may be connected to a plurality of clients included in a second region. The first region may be distinguished from the second region. For example, the first region may refer to a left-upper region in the entire chip area of the multi-layer memory 200 in FIG. 7B, and the second region may refer to a right-upper region in the entire chip area (e.g., the area of the surface of the chip). That is, each data hub may be connected to clients physically adjacent (e.g., within the certain distance) to each data hub and may be configured to process client data. Therefore, without one controller 120 being individually connected to all the clients as in FIG. 7A, each data hub may include electrical connections to the clients adjacent thereto. Therefore, connections between the controller 120 and clients far from the controller 120 may be omitted or reduced, thereby improving the space efficiency. According to some example embodiments, the certain distance may be a design parameter determined through empirical study.

According to various embodiments, it may be assumed that the controller 120 in FIG. 7A processes data of a large number of clients (for example, 100 clients) and each data hub in FIG. 7B processes data of 10 clients. The complexity of a logic circuit for processing data of a controller or data hub may be proportional to the square of the number of clients connected to the controller or data hub. That is, the controller 120 in FIG. 7A may use a logic circuit having a complexity of 10000 to process data received from 100 clients. On the other hand, one data hub (for example, the data hub 220-1) in FIG. 7B may use a logic circuit having a complexity of 100. It may be assumed that, as the complexity of the logic circuit increases, the area for implementing the logic circuit also increases proportionally thereto. Thus, the one data hub in FIG. 7B may use the logic circuit having a complexity of 100. As described above, when one data hub is connected to 10 clients, the one data hub may have a complexity of 100, and because 10 data hubs are connected to 100 clients, the complexity of the overall chip may correspond to 1000. Therefore, the amount of processing of the controller 120 may be dispersed in a large number of data hubs, whereby the area of a circuit for processing client data may be reduced tenfold.

According to various embodiments, the data transfer unit 230 may be connected to a plurality of data hubs. Because the number of connections between the plurality of data hubs 220-1 to 220-4 and the data transfer unit 230 is significantly reduced as compared with the number of connections between the controller 120 and the plurality of clients far or further from the controller 120 in FIG. 7A, the space efficiency of the chip area (e.g., an amount of data processed and/or stored in the target memory 150 with respect to area of the surface of the chip) may be improved.

According to various embodiments, the data transfer unit 230 may receive burst data that has been processed by a plurality of data hubs. Therefore, the data transfer unit 230 may be implemented by using only FIFO-type buffer memories (e.g., the third-layer memory 410), an output selector 420, and/or a DMA controller 430. On the other hand, a bank memory 144 and an output multiplexer 146 included in the controller 120 in FIG. 7A may have greater complexity and occupy a larger area than the data transfer unit 230. This is because the bank memory 144 included in the controller 120 in FIG. 7A includes banks in a number corresponding to the number of clients and the complexity of the output multiplexer for outputting one piece of client data of all pieces of client data may also be great.

According to various embodiments, a connection between a data hub (for example, the first data hub 220-1) and the data transfer unit 230 in FIG. 7B may be simpler than a connection between a client and the controller 120 in FIG. 7A. For example, the controller 120 in FIG. 7A may receive client data directly from the client, and the size of the client data may increase along with the development of communication systems. That is, while the controller 120 in FIG. 7A uses a larger electrical wiring line for transmitting the client data of an increased size (for example, 256 bits), the data transfer unit 230 in FIG. 7B may receive, from the data hub 220-1, burst data having a standardized number of bits. For example, the data transfer unit 230 may always or frequently receive 128 bits of burst data from the data hub 220-1 regardless of an increase in size of client data. Therefore, an electrical wiring line between the data hub 220-1 and the data transfer unit 230 may be smaller in physical size than an electrical wiring line for transmitting client data itself.

Figure 8:
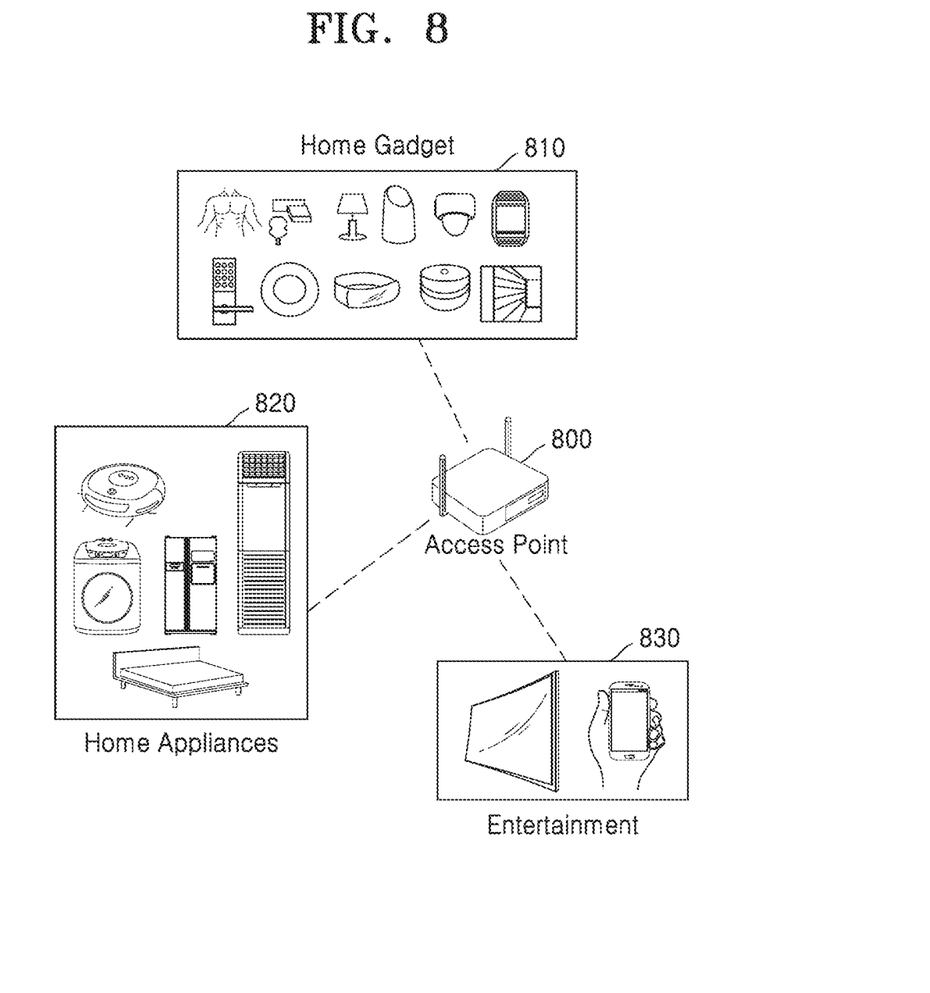
FIG. 8 illustrates examples of communication devices including multi-layer memory according to an embodiment of the inventive concepts.

FIG. 8 illustrates examples of communication devices including multi-layer memory according to an embodiment of the inventive concepts.

Referring to FIG. 8, an access point (AP) 800, home gadgets 810, home appliances 820, and/or entertainment devices 830 may include the multi-layer memory 200 according to embodiments of the inventive concepts. In some embodiments, the AP 800, the home gadgets 810, the home appliances 820, and/or the entertainment devices 830 may constitute Internet of Things (IoT) network systems. According to some example embodiments, the multi-layer memory may be included in other communication devices such as a terminal and/or a base station. The terminal may be one or more of user equipment (UE), a next generation UE (NG UE), a mobile station (MS), mobile equipment (ME), a smartphone, a tablet personal computer (PC), a mobile phone, a video phone, an e-book reader, a desktop PC, a laptop PC, a netbook computer, a personal digital assistant (PDA), etc. The base station may be one or more of a NodeB (NB), an eNodeB (eNB), a next generation radio access network (NG RAN), a wireless access unit, etc.

It will be understood that communication apparatuses shown in FIG. 8 are merely examples and, although not shown in FIG. 8, other apparatuses for performing communication may also include the communication device according to an example embodiment of the inventive concepts.

While the inventive concepts have been particularly shown and described with reference to embodiments thereof, it will be understood by those skilled in the art that various changes in form and details may be made therein without departing from the spirit and scope of the following claims. In addition, it should be understood that particular terms used herein are only for the purpose of describing embodiments and are not intended to limit the inventive concepts. Therefore, the scope of the inventive concepts should be defined by the accompanying claims and equivalents thereof.

What is claimed is:

1. A communication device comprising:
   a first client group including a plurality of first clients in a first region of a chip;
   a second client group including a plurality of second clients in a second region of the chip different from the first region;
   a first data huh configured to generate first burst data and a first control packet based on first client data received from the first client group, the first control packet including a first destination address of the first burst data;
   a second data hub configured to generate second burst data and a second control packet based on second client data received from the second client group, the second control packet including a second destination address of the second burst data, and the plurality of first clients, the plurality of second clients, the first data hub and the second data hub all being on the chip; and
   a data transfer unit connected to the first data hub and the second data hub via a control protocol, the data transfer unit configured to, store the first burst data in a target memory based on the first control packet, and store the second burst data in the target memory based on the second control packet, wherein the first region is located within a first certain physical distance from the first data hub, and wherein the second region is located within a second certain physical distance from the second data hub.

2. The communication device of claim 1, wherein the plurality of first clients are connected to a first power supply; and the plurality of second clients are connected to a second power supply.

3. The communication device of claim 1, wherein the first data hub includes, a first buffer memory configured to,
  receive the first client data from the plurality of first clients, and
  store the first client data;

a first packing unit configured to convert first client data stored in the first buffer memory into a first client data block having a defined data size;

a first bank memory configured to store the first client data block, the first bank memory including a plurality of first memory banks; and a first burst generator configured to generate the first burst data based on the first client data block stored in one first memory bank among the plurality of first memory banks; and the second data hub includes, a second buffer memory configured to,
  receive the second client data from the plurality of second clients, and
  store the second client data;

a second packing unit configured to convert the second client data stored in the second buffer memory into a second client data block having the defined data size;

a second bank memory configured to store the second client data block, the second bank memory including a plurality of second memory banks; and a second burst generator configured to generate the second burst data based on the second client data block stored in one second memory bank among the plurality of second memory banks.

4. The communication device of claim 3, wherein the data transfer unit comprises:

a third buffer memory configured to store the first burst data and the second burst data;

a selector configured to output one of the first burst data or the second burst data stored in the third buffer memory as selected burst data; and a direct memory access (DMA) controller configured to store the selected burst data in the target memory.

5. The communication device of claim 1, wherein the first control packet includes, a first client identification (ID) bit indicating a first client among the plurality of first clients, a first burst offset bit indicating the first destination address, the first destination address indicating a first location of the target memory at which the first burst data is to be stored, a first burst ID bit indicating a first interrupt corresponding to the first burst data, and a first reserved bit; and the second control packet includes, a second client identification (ID) bit indicating a second client among the plurality of second clients, a second burst offset bit indicating the second destination address, the second destination address indicating a second location of the target memory at which the second burst data is to be stored, a second burst ID bit indicating a second interrupt corresponding to the second burst data, and a second reserved bit.

6. The communication device of claim 1, wherein the control protocol comprises:

a control signal, a data signal, an interrupt signal, and a ready signal.

7. The communication device of claim 6, wherein the first data hub is configured to transmit to the data transfer unit, a first control signal indicating a first type of data being transmitted by the first data hub to the data transfer unit, a first data signal including the first control packet or the first burst data, and a first interrupt signal indicating an end of transmission of the first burst data;

the second data hub is configured to transmit to the data transfer unit, a second control signal indicating a second type of data being transmitted by the second data hub to the data transfer unit, a second data signal including the second control packet or the second burst data, and a second interrupt signal indicating an end of transmission of the second burst data; and the data transfer unit is configured to transmit he ready signal to the first data hub and the second data hub, the ready signal indicating whether the data transfer unit is able to receive data.

8. The communication device of claim 7, wherein the first data hub is configured to, transmit the first control packet to the data transfer unit when the first data hub receives the ready signal and the first control signal indicates the first type of data is control packet data, and transmit the first burst data to the data transfer unit when the first data hub receives the ready signal and the first control signal indicates the first type of data is burst packet data; and the second data hub is configured to, transmit the second control packet to the data transfer unit when the second data hub receives the ready signal and the second control signal indicates the second type of data is control packet data, and transmit the second burst data to the data transfer unit when the second data hub receives the ready signal and the second control signal indicates the second type of data is burst packet data.

9. The communication device of claim 8, wherein the first data hub is configured to transmit the first burst data to the data transfer unit from a timing of transmission of the first control packet to a timing of transmission of the first interrupt signal; and the second data hub is configured to transmit the second burst data to the data transfer unit from a timing of transmission of the second control packet to a timing of transmission of the second interrupt signal.

10. An electronic device comprising:

the communication device of claim 1; and an application processor (AP).

11. The electronic device of claim 10, wherein the communication device and the AP are implemented as the chip.

12. A communication device comprising:
a first power supply;
a second power supply;
a plurality of first clients connected to the first power supply;
a plurality of second clients connected to the second power supply;
a first data hub configured to receive first client data from each of the plurality of first clients;
a second data hub configured to receive second client data from each of the plurality of second clients, the plurality of first clients, the plurality of second clients, the first data hub and the second data hub all being on a same chip;
a data transfer unit configured to,
receive a first control packet and first burst data from the first data hub, and
receive a second control packet and second burst data from the second data hub; and
a target memory connected to the data transfer unit,
wherein the plurality of first clients is located within a first certain physical distance from the first data hub, and
wherein the plurality of second clients is located within a second certain physical distance from the second data hub.

13. The communication device of claim 12, further comprising:
a first buffer memory connected to at least one of the plurality of first clients or the plurality of second clients;
a packing unit configured to convert one of the first client data or the second client data stored in the first buffer memory into a client data block having a defined data size;
a bank memory configured to store the client data block, the bank memory including a plurality of memory banks; and
a burst generator configured to output one of the first burst data or the second burst data based on the client data block stored in one memory bank among the plurality of memory banks.

14. The communication device of claim 13, wherein the data transfer unit comprises:
a second buffer memory configured to store the first burst data and the second burst data;
a selector configured to output one of the first burst data or the second burst data stored in the second buffer memory as selected burst data; and
a direct memory access (DMA) controller configured to store the selected burst data in the target memory.

15. The communication device of claim 12, wherein
the first control packet includes,
a first client identification (ID) bit indicating a first client among the plurality of first clients,
a first burst offset bit indicating a first address of the target memory at which the first burst data is to be stored,
a first burst ID bit indicating a first interrupt corresponding to the first burst data, and
a first reserved bit; and
the second control packet includes,
a second client identification (ID) bit indicating a second client among the plurality of second clients,
a second burst offset bit indicating a second address of the target memory at which the second burst data is to be stored,
a second burst ID bit indicating a second interrupt corresponding to the second burst data, and
a second reserved bit.

16. The communication device of claim 15, wherein
the first data hub transmits the first control packet contemporaneous with initiation of transmission of the first burst data; and
the second data hub transmits the second control packet contemporaneous with initiation of transmission of the second burst data.

17. The communication device of claim 12, wherein
the first burst data has a defined data size capable of being processed by a processor; and
the second burst data has the defined data size.

18. The communication device of claim 13, wherein the first buffer memory is a static random access memory (SRAM).

19. The communication device of claim 13, wherein the target memory is a dynamic random access memory (DRAM).

* * * * *